United States Patent
Matsumoto et al.

(10) Patent No.: US 10,969,761 B2
(45) Date of Patent: Apr. 6, 2021

(54) OPERATION MACHINE

(71) Applicant: FUJI CORPORATION, Chiryu (JP)

(72) Inventors: Toru Matsumoto, Okazaki (JP);
Kazuma Ishikawa, Chiryu (JP)

(73) Assignee: FUJI CORPORATION, Chiryu (JP)

(*) Notice: Subject to any disclaimer, the term of this patent is extended or adjusted under 35 U.S.C. 154(b) by 35 days.

(21) Appl. No.: 16/346,281

(22) PCT Filed: Nov. 17, 2016

(86) PCT No.: PCT/JP2016/084033
§ 371 (c)(1),
(2) Date: Apr. 30, 2019

(87) PCT Pub. No.: WO2018/092228
PCT Pub. Date: May 24, 2018

(65) Prior Publication Data
US 2019/0250584 A1  Aug. 15, 2019

(51) Int. Cl.
*G05B 19/00* (2006.01)
*G05B 19/402* (2006.01)
(Continued)

(52) U.S. Cl.
CPC .......... *G05B 19/402* (2013.01); *H05K 13/02* (2013.01); *H05K 13/021* (2013.01);
(Continued)

(58) Field of Classification Search
CPC .............. G05B 19/402; H05K 13/089; H05K 13/0812; H05K 13/0813; H05K 13/02;
(Continued)

(56) References Cited

U.S. PATENT DOCUMENTS 6,158,117 A * 12/2000 Mimura ............ H05K 13/0413
29/833
9,778,647 B2  10/2017 Teshima et al.
(Continued)

FOREIGN PATENT DOCUMENTS

CN       105848825 A    8/2016
EP       2 717 666 A1   4/2014
(Continued)

OTHER PUBLICATIONS

International Search Report dated Feb. 14, 2017 in PCT/JP2016/084033 filed on Nov. 17, 2016.

*Primary Examiner* — Ping Y Hsieh
(74) *Attorney, Agent, or Firm* — Oblon, McClelland, Maier & Neustadt, L.L.P.

(57) ABSTRACT

If the moving direction of a suction nozzle during raising and lowering deviates from a vertical direction, appropriate work cannot be guaranteed because the holding position of a component by the suction nozzle will vary depending on the holding height of the component by the suction nozzle. Thus, a component loaded at a specified height (H) position from the upper surface of a stage is held by a suction nozzle, and that component is loaded at a specified position. Then, the component is imaged and the loading position (first height component loading position) of the component is calculated. Further, the component loaded on the stage is held by the suction nozzle and the component is loaded at the above specified position. Then, the component is imaged and the component loading position (second height component loading position) is calculated. Next, the deviation amount between the first height component loading position and the second height component loading position is calculated. Thus, appropriate mounting can be guaranteed by performing correction of the component holding position, (Continued)

correction of the component loading position, or the like, based on the deviation amount.

3 Claims, 12 Drawing Sheets

(51) Int. Cl.
  *H05K 13/08* (2006.01)
  *H05K 13/04* (2006.01)
  *H05K 13/02* (2006.01)
(52) U.S. Cl.
  CPC ....... *H05K 13/043* (2013.01); *H05K 13/0413* (2013.01); *H05K 13/089* (2018.08); *H05K 13/0812* (2018.08); *H05K 13/0813* (2018.08)
(58) Field of Classification Search
  CPC . H05K 13/021; H05K 13/0413; H05K 13/043
  See application file for complete search history.

(56) References Cited

U.S. PATENT DOCUMENTS

2015/0355626 A1* 12/2015 Teshima ............... G05B 19/402
  700/114
2016/0330880 A1* 11/2016 Morikawa ............ H05K 13/021

FOREIGN PATENT DOCUMENTS

| EP | 3 088 128 A1 | 11/2016 |
| JP | 7-9381 A | 1/1995 |
| JP | 2012-248796 A | 12/2012 |
| JP | WO 2014/103027 A1 | 7/2014 |

* cited by examiner

OPERATION MACHINE

TECHNICAL FIELD

The present application relates to an operation machine provided with a holding head including a holding tool capable of holding a component loaded at a given position, and a moving device configured to move the holding head.

BACKGROUND ART

There are operation machines provided with a holding head including a holding tool capable of holding a component loaded at a given position, and a moving device configured to move the holding head, such operation machines being configured to perform work of mounting a component held by the holding tool at a specified position. With such an operation machine, there are cases in which the moving direction of a holding tool when being raised or lowered is tilted with respect to a predetermined set direction such as a vertical direction, so it is desirable to perform component holding work and mounting work considering the moving direction tilt when raising and lowering the holding tool. The patent literature below discloses imaging a holding tool and, based on the imaging data, calculating a moving direction tilt during raising and lowering of the holding tool and performing component holding work, mounting work, and the like, in consideration of the tilt.

Patent literature 1: International publication WO2014/103027

BRIEF SUMMARY

Technical Problem

According to technology disclosed in the patent literature above, by calculating a moving direction tilt during raising and lowering of the holding tool, it is possible to appropriately perform component holding work, mounting work, and the like, but by calculating the moving direction tilt during raising and lowering of the holding tool even more appropriately, it becomes possible to perform component holding work, mounting work, and the like even more appropriately. The present disclosure takes account of such circumstances and an object thereof is to appropriately estimate the moving direction tilt during raising and lowering of a holding tool.

Solution to Problem

To solve the above problems, disclosed herein is an operation machine including: a holding head including a holding tool configured to hold a component loaded at a given position; an imaging device configured to image the component loaded at the given position; a moving device configured to move the holding head; and a control device, the control device being provided with a first operation control section configured to control operation of the holding head and the moving device such that the component loaded at a first height is held by the holding tool, and the component held by the holding tool is loaded to a set position, a first imaging section configured to image the component loaded at the set position by the first operation control section, a second operation control section configured to control operation of the holding head and the moving device such that the holding tool holds the component loaded at a second height that is different to the first height, and loads the component held by the holding tool at the set position, a second imaging section configured to image the component loaded at the set position by the second operation control section, and a calculating section configured to calculate a position deviation amount of the loaded component based on imaging data acquired by the first imaging section and imaging data acquired by the second imaging section.

Advantageous Effects

According to the present disclosure, by calculating a deviation amount of the loading position of a component when a component loaded at positions with different heights is loaded at a specified position, it is possible to appropriately estimate the moving direction tilt during raising and lowering of the holding tool.

DESCRIPTION OF PREFERRED EMBODIMENTS

The following describes in detail referring to the figures an embodiment for the present disclosure.

(A) Configuration of Component Mounter

Figure 1:
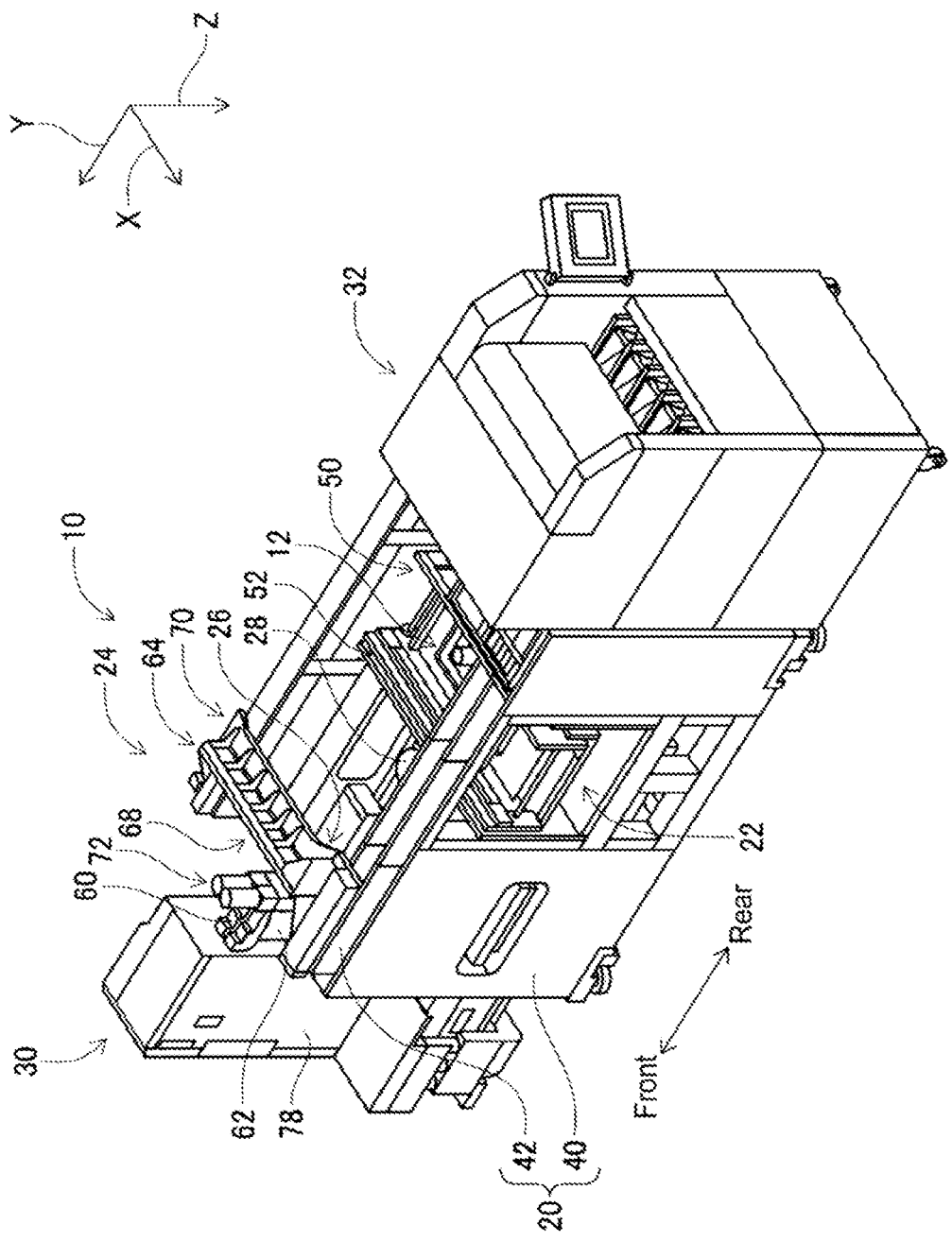
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device 34 (refer to FIG. 11). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
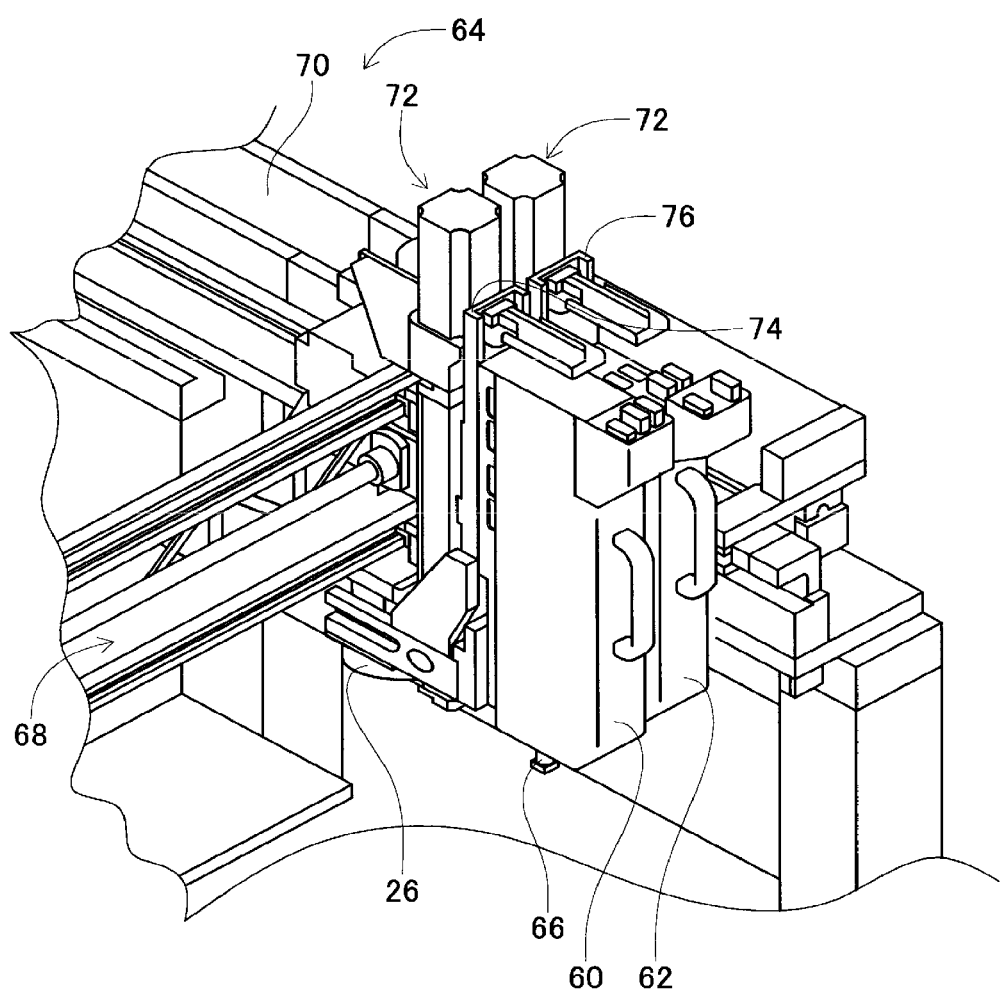
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
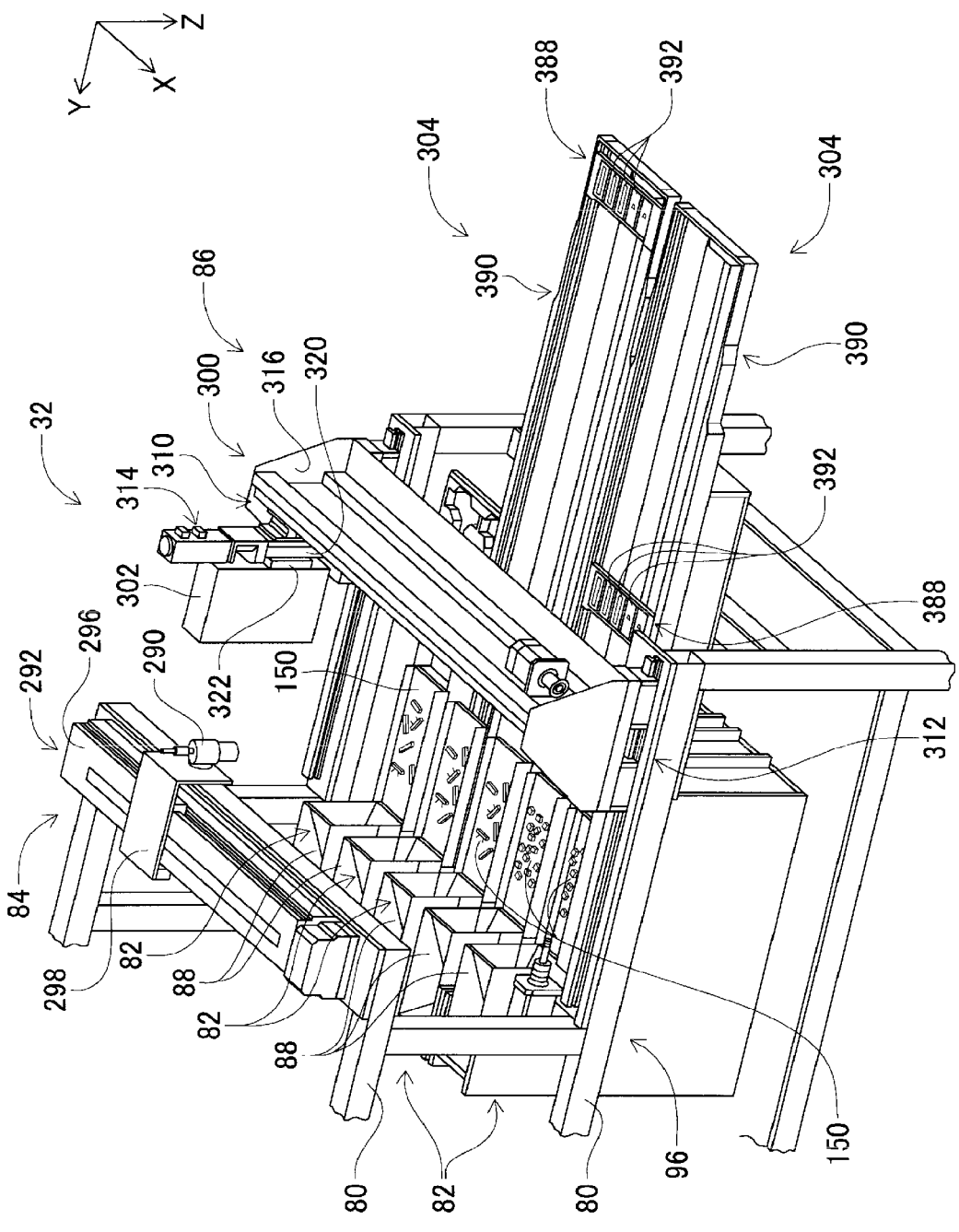
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 5), with component supply apparatus 88, component scattering device 90, and component returning device 92 being integrated into one unit. Component supply unit 82 is assembled to be removable from base 96 of main body 80, and with loose component supply device 32, five component supply units 82 are arranged in one row in the X direction.

(i) Component Supply Apparatus

Figure 4:
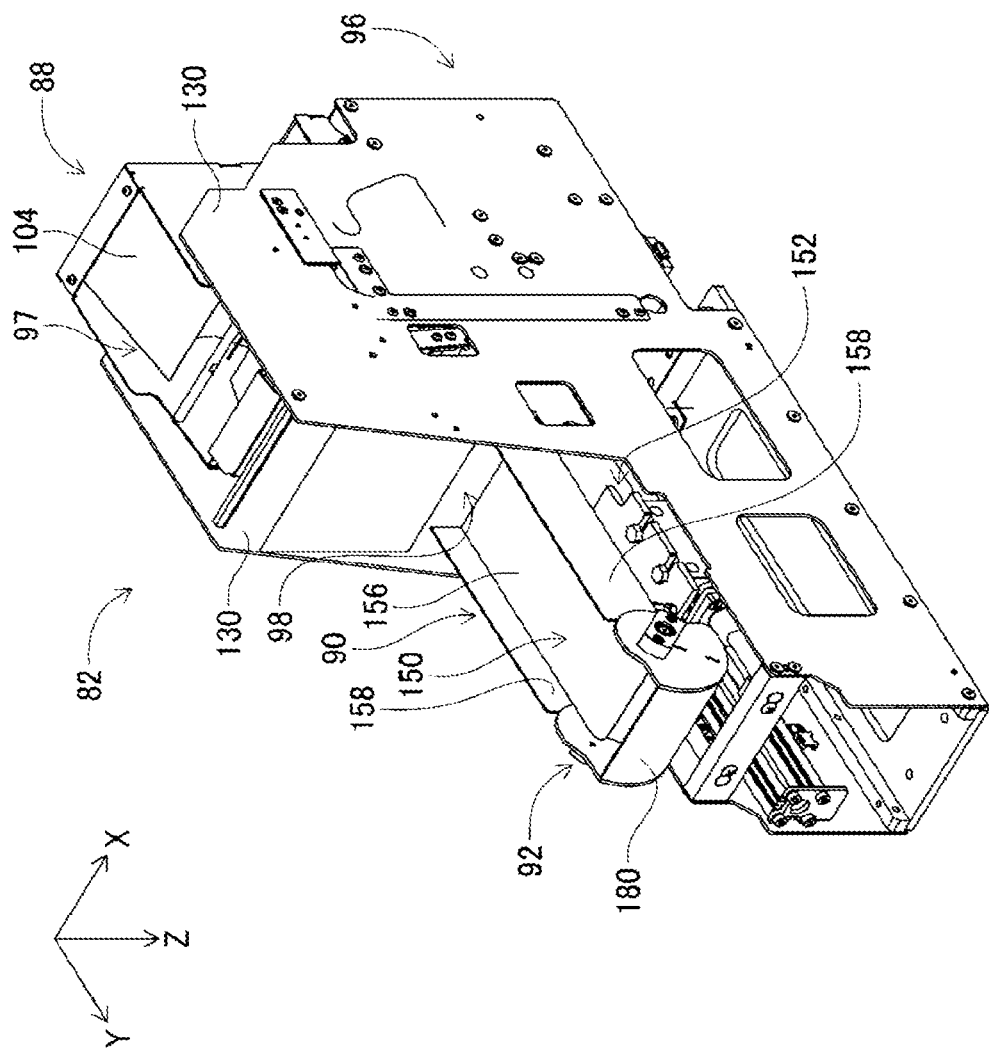
FIG. 4 is a perspective view of a component supply unit.
Figure 5:
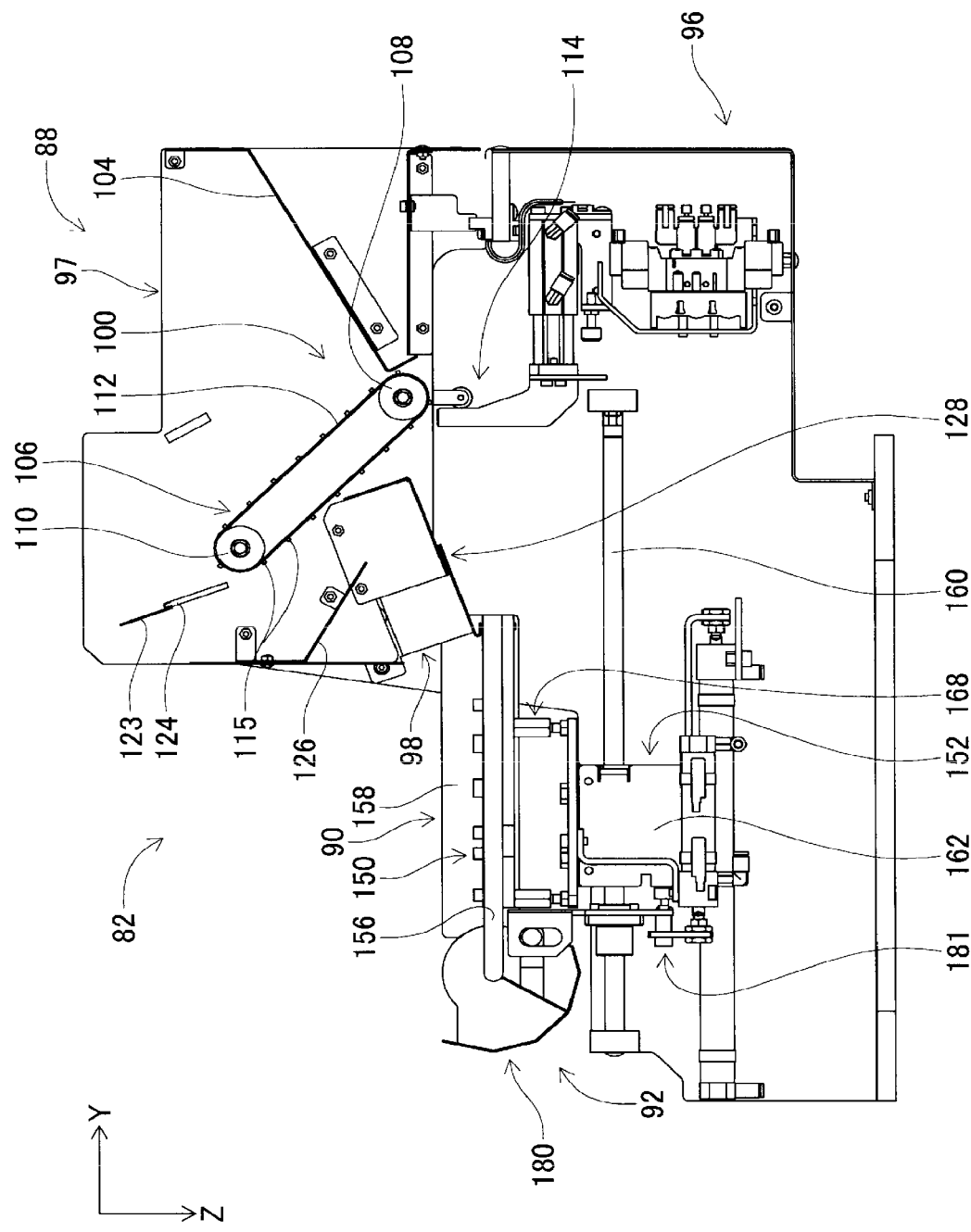
FIG. 5 is a cross section view of the component supply unit.

As shown in FIGS. 4 and 5, component supply apparatus 88 is a substantially cuboid box arranged to extend in the Y direction. The Y direction is the front-rear direction of component supply apparatus 88 with the left side in FIG. 5 sometimes referred to as the front and the right side in FIG. 5 sometimes referred to as the rear. That is, in component supply unit 82, the side towards the end at which component returning device 92 is arranged is sometimes referred to as the front, and the side towards the end at which component supply apparatus 88 is arranged is sometimes referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged across the entire width (X direction) of component supply apparatus 88 and is inclined from the rear end surface of component supply apparatus 88 towards the center such that the front end of inclined plate 104 is positioned lower than the rear end.

Also, as shown in FIG. 5, conveyor device 106 is arranged at the front side of inclined plate 104. Conveyor device 106 includes a pair of rollers 108 and 110, and conveyor belt 112. Each of the rollers 108 and 110 are arranged inside component supply apparatus 88 extending in the width direction of component supply apparatus 88 across the entire width of component supply apparatus 88. Further, roller 108 faces the front end of inclined plate 104, that is, the lowest end of inclined plate 104, with a clearance gap between them. Note that, the clearance between the front end of inclined plate 104 and roller 108 is smaller than components that are supplied by component supply apparatus 88. Also, roller 110 is arranged diagonally above and to the front of roller 108. Conveyor belt 112 is stretched over the pair of rollers 108 and 110. Note that, conveyor belt 112 has a width slightly less than the internal width dimension of component supply apparatus 88.

Also, the pair of rollers 108 and 110 are rotatable around their center axis, with rotation being controlled by operation of rotation device 114. The rotation direction of rollers 108 and 110 is the counterclockwise direction in FIG. 5. Thus, conveyor belt 112 revolves around rollers 108 and 110 in a counterclockwise direction in FIG. 5. In other words, the conveyance direction of conveyor belt 112 is diagonally up from the front end of inclined plate 104. Multiple protrusions 115 are formed in the upper surface, that is, the conveyance surface, of conveyor belt 112 extending across the width of conveyor belt 112. The multiple protrusions 115 are formed at specified intervals in the revolving direction of conveyor belt 112 with the intervals being longer than the length direction of components supplied by component supply apparatus 88.

Also, brush holding section 123 is arranged diagonally above and in front of roller 110 of conveyor device 106. Brush holding section 123 is arranged extending in the width direction of component supply apparatus 88 across the entire width of component supply apparatus 88. Brush 124 is attached to the lower end of brush holding section 123 extending towards roller 110 of conveyor device 106. The width dimension of brush 124 is slightly smaller than the internal width dimension of component supply apparatus 88 and faces conveyor belt 112 wound around roller 110 across the entire width direction of component supply apparatus 88 with a clearance gap between brush 124 and conveyor belt 112. The clearance between the tip of brush 124 and conveyor belt 112 wound around roller 110 is longer than the thickness dimension of components supplied by component supply apparatus 88 and less than two times the thickness dimension of components supplied by component supply apparatus 88.

Also, inclined plate 126 is arranged diagonally below and in front of roller 110 of conveyor device 106. Inclined plate 126 is arranged across the entire width of component supply apparatus 88 and is inclined from the front end surface of component supply apparatus 88 to below roller 110 such that the rear end of inclined plate 126 is positioned lower than the front end. Further, inclined plate 128 is arranged below inclined plate 126. Inclined plate 128 is arranged across the entire width of component supply apparatus 88 and is inclined from below a central portion of conveyor device 106 towards discharge opening 98 of component supply apparatus 88 such that the front end of inclined plate 128 is positioned lower than the rear end. The rear end of inclined plate 128 is positioned further to the rear than the rear end of inclined plate 126, and the rear end of inclined plate 128 is bent upward at a right angle. The front end of inclined plate 128 is bent to the rear to be substantially horizontal.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130.

(ii) Component Scattering Device

Component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the bent front end of inclined plate 128 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Further, as shown in FIG. 5, component support section moving device 152 includes guide rail 160 and slider 162. Guide rail 160 extends in the lengthwise direction of stage 156 below component support member 150. Slider 162 is slidably attached to guide rail 160 so as to be slid to any position by operation of electromagnetic motor 166 (refer to FIG. 11). Stage 156 of component support member 150 is connected to slider 162 via connection mechanism 168. Thus, component support member 150 moves in the Y direction by operation of component support member moving device 152, so as to move to and from a stored state (refer to FIG. 6) stored below component supply apparatus 88 and an exposed state (refer to FIG. 5) drawn out from below component supply apparatus 88.

(iii) Component Returning Device

Figure 7:
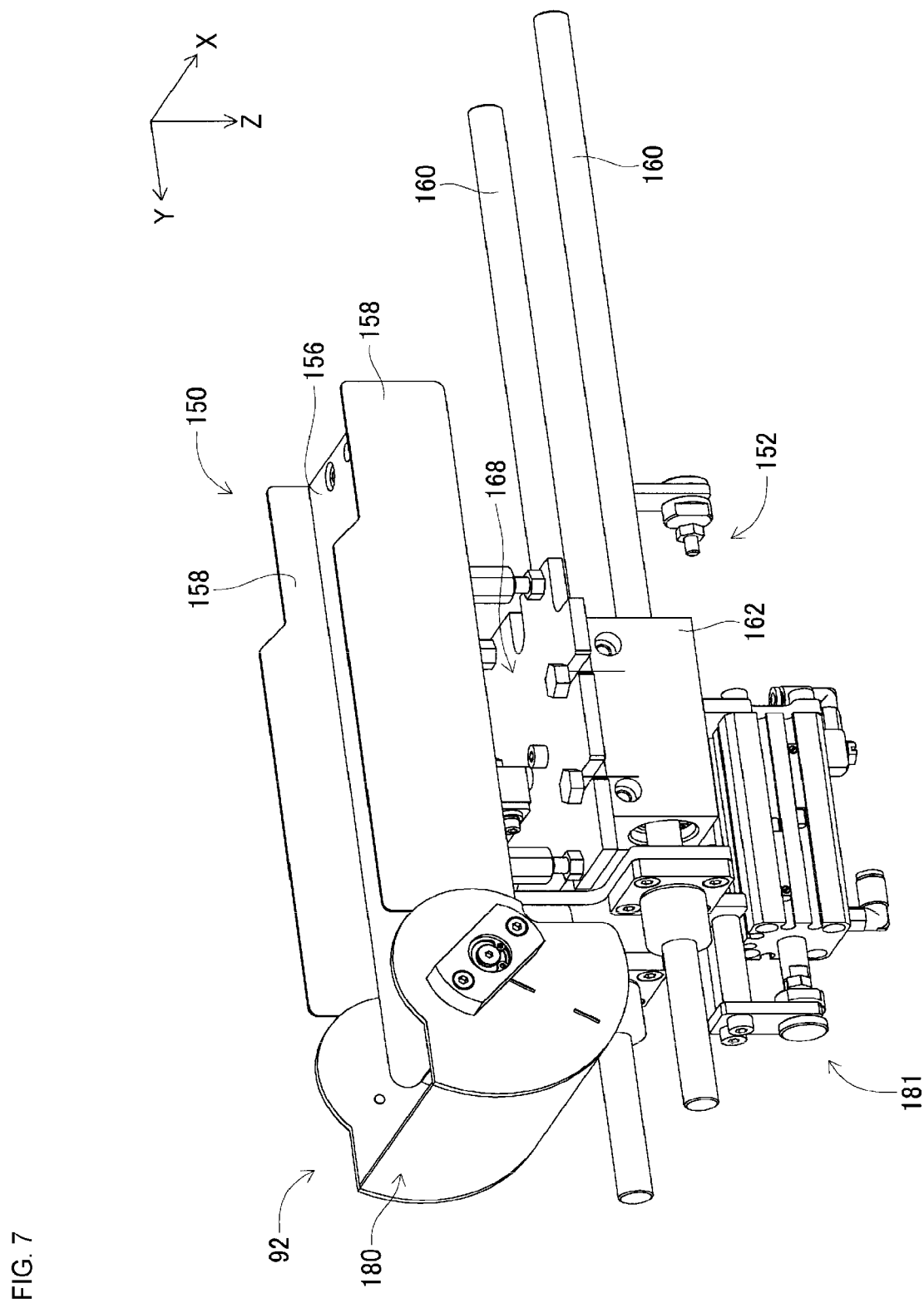
FIG. 7 is a perspective view of a component scattering device.
Figure 8:
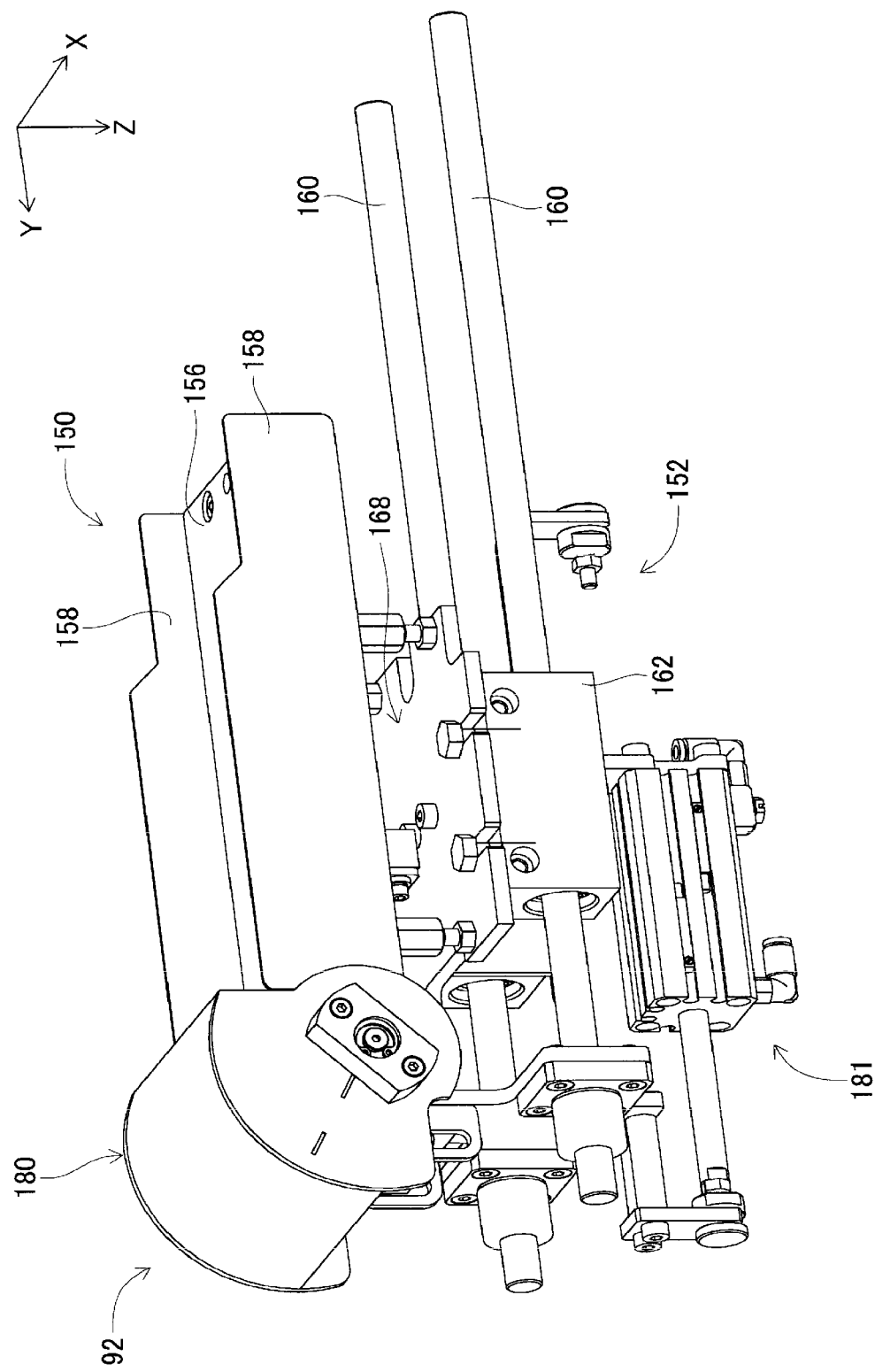
FIG. 8 is a perspective view of a component scattering device.

As shown in FIG. 7, component returning device 92 includes component collection container 180 and container oscillating device 181. Component collection container 180 is a box with an arc-shaped bottom surface. Component collection container 180 is held to be swingable around the front end of stage 156 of component holding member 150 and is swung by operation of container oscillating device 181. Here, component collection container 180 is swung between a collection orientation (refer to FIG. 7) with the opening facing up, and a return orientation (refer to FIG. 8) with the opening facing the upper surface of stage 156 of component support member 150.

(b) Imaging Device

As shown in FIG. 3, imaging device 84 includes camera 290 and camera moving device 292. Camera moving device 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 11). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 and extending in the X direction, and Y slider 316 is moved to any position in the Y direction by operation of electromagnetic motor 319 (refer to FIG. 11). X-direction moving device 310 includes X slider 320 provided on a side surface of Y slider 316, and X slider 320 is moved to any position in the X direction by operation of electromagnetic motor 321 (refer to FIG. 11). Z-direction moving device 314 includes Z slider 322 provided on a side surface of X slider 320, and Z slider 322 is moved to any position in the Z direction by operation of electromagnetic motor 323 (refer to FIG. 11).

Figure 9:
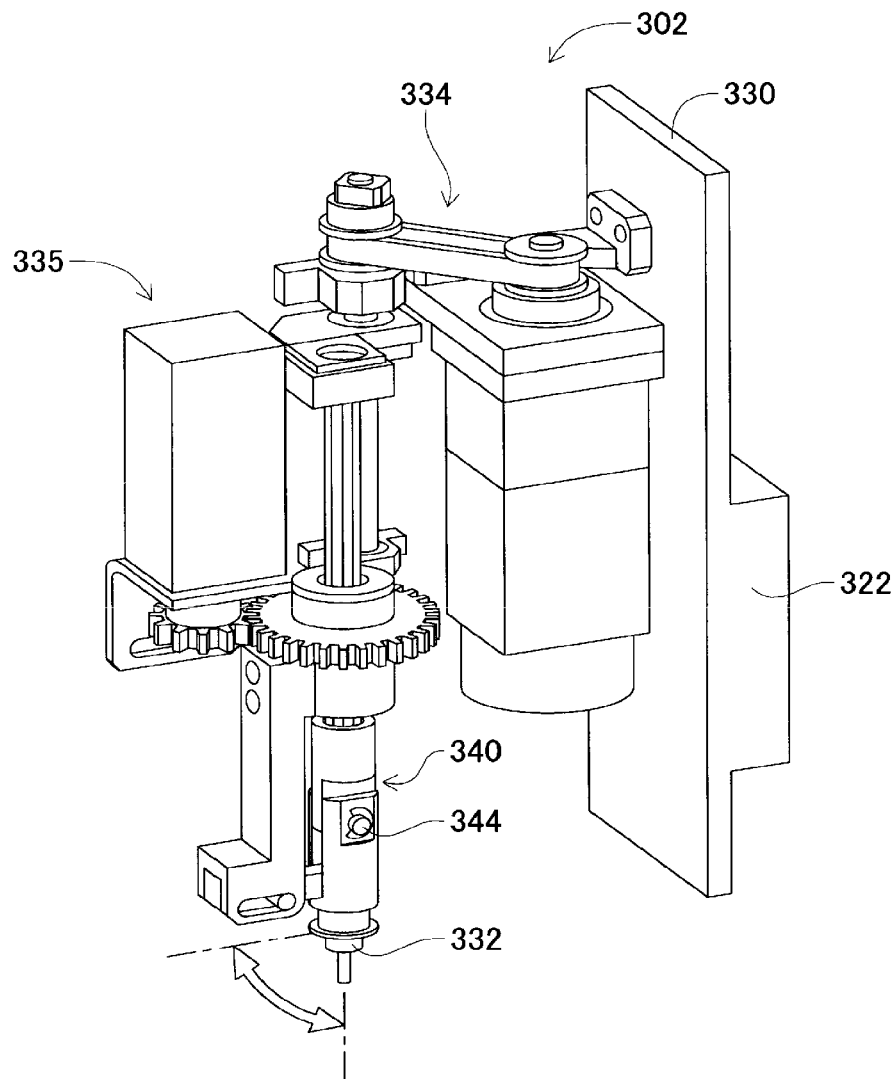
FIG. 9 is a perspective view of a component holding head.

As shown in FIG. 9, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 10:
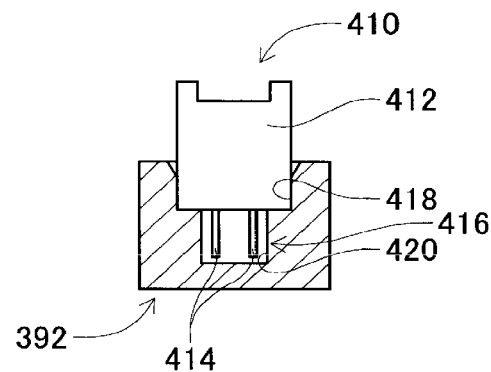
FIG. 10 shows a component receiving member in which is stored a leaded component.

In detail, as shown in FIG. 10, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392 in accordance with the shape of leaded component 410. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 11). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 11:
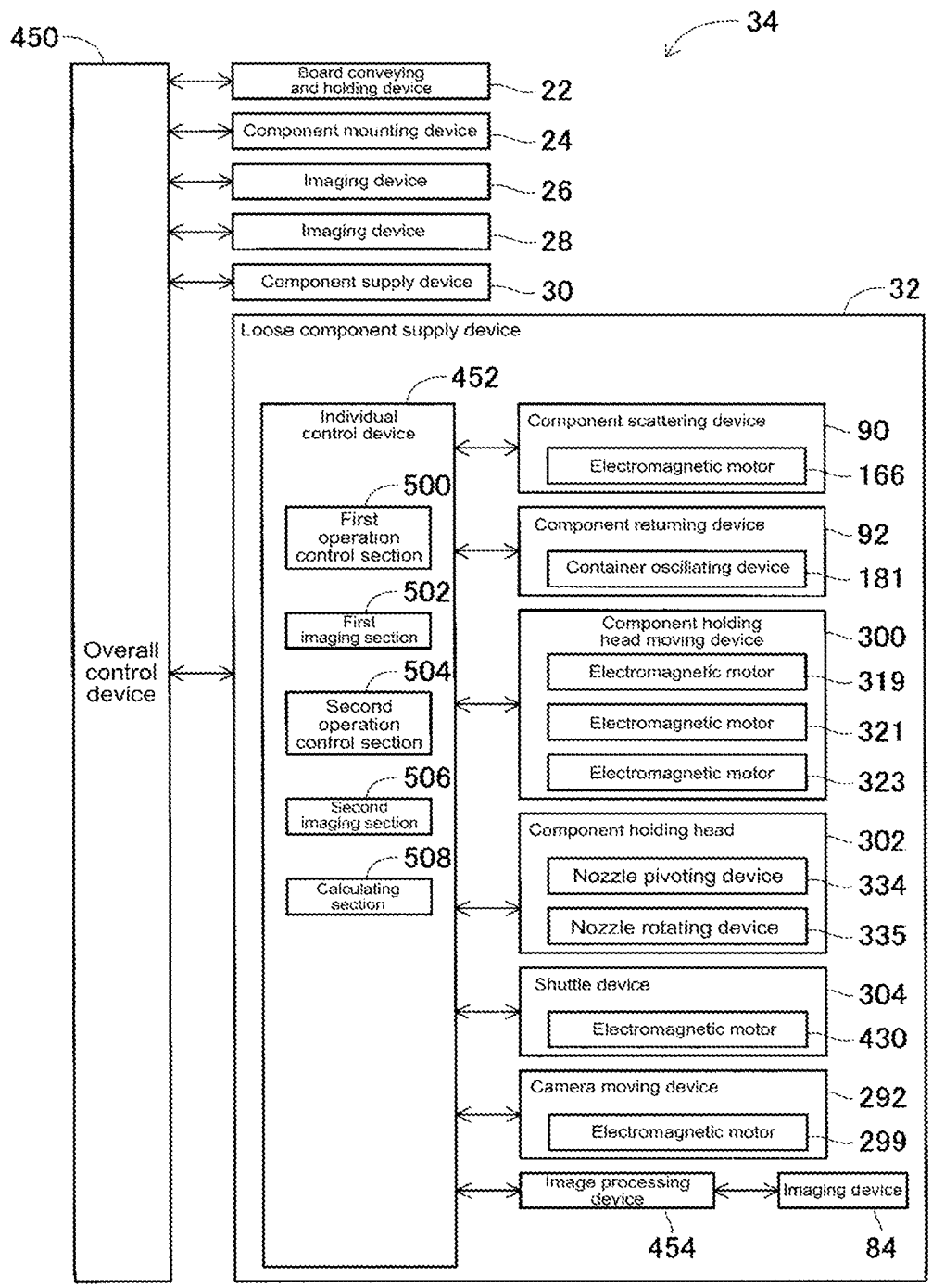
FIG. 11 is a block diagram showing a control device of the component mounter.

Further, as shown in FIG. 11, control device 34 includes overall control device 450, multiple individual control devices (only one is shown in the FIG. 452, and image processing device 454. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84.

(B) Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

(C) Operation of Loose Component Supply Device (a) Supply of Leaded Components Using Loose Component Supply Device With loose component supply device 32, leaded components 410 are inserted by an operator into insertion opening 97 of component supply apparatus 88, then, the inserted leaded components 410 are supplied in a state loaded on component receiving member 392 of component carrier 388 by operation of component supply unit 82 and component transfer device 86. In detail, the operator inserts leaded components 410 via insertion opening 97 at the top of component supply apparatus 88. Here, component supporting member 150 is moved below component supply apparatus 88 by operation of component support member moving device 152 to be in a stored state (refer to FIG. 6). With component support member 150 in a stored state, component collection container 180 positioned at the front end of component support member 150 is positioned in front of component supply apparatus 88, and the opening of component collection container 180 is oriented facing up (collection orientation).

Figure 6:
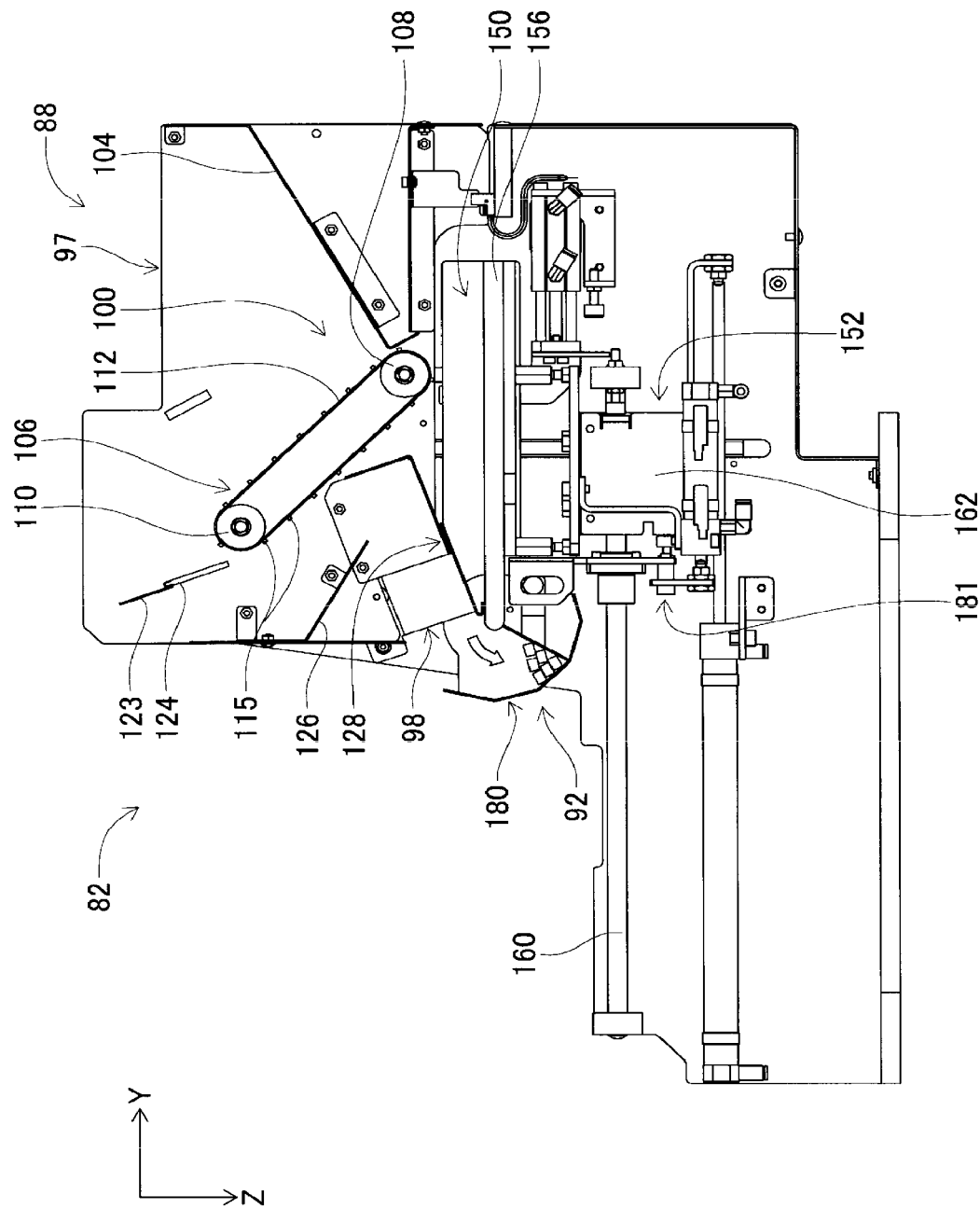
FIG. 6 is a cross section view of the component supply unit.

Leaded components 410 inserted via insertion opening 97 on the top surface of component supply apparatus 88 fall onto inclined plate 104 of component supply apparatus 88 and roll down to the front lower end of inclined plate 104. Here, leaded components 410 that have rolled down to the front bottom end of inclined plate 104 pile up between the front bottom end of inclined plate 104 and the rear bottom end of conveyor device 106. In other words, between the lower front end of inclined plate 104 and the lower rear end of conveyor device 106 functions as housing section 100 for housing leaded components 410. Then, when rotation device 116 of conveyor device 106 is operated, conveyor belt 112 of conveyor device 106 is rotated counterclockwise as shown in FIG. 6. By this, leaded components 410 piled up in housing section 100 are conveyed by conveyor belt 112 diagonally up and forward.

Then, leaded components 410 conveyed diagonally up by conveyor belt 112 pass between the upper end on the front side of conveyance device 106 and brush 124 and fall onto inclined plate 126 provided below the upper end on the front side of conveyance device 106 and brush 124. Leaded components 410 that have fallen onto inclined plate 126 roll towards the rear of inclined plate 126 onto inclined plate 128 provided below inclined plate 126. Then, leaded components 410 that have fallen onto inclined plate 128 roll towards the front and are discharged from discharge opening 98 at the front of component supply apparatus 88. In this manner, leaded components 410 that have fallen from the front end of conveyor device 106 fall onto inclined plate 126 and then onto inclined plate 128. That is, leaded components 410 are discharged from discharge opening 98 of component supply apparatus 88.

Component support member 150 is moved towards the front from under component supply apparatus 88 due to operation of component supply member moving device 152 at the time that leaded components 410 are discharged from discharge opening 98 of component supply apparatus 88. By this, leaded components 410 discharged from discharge opening 98 of component supply apparatus 88 are discharged onto the upper surface of stage 156 of component support member 150.

Then, component support member 150 is moved forwards from the stored state to the exposed state and then movement of component support member 150 is stopped. By this, leaded components 410 are scattered across the entire upper surface of stage 156. With component supply apparatus 88, operation of conveyor device 106 is stopped to match the timing of the stopping of the operation of component support member 150 such that leaded components 410 are discharged finally from component supply apparatus 88.

According to the above procedure, when leaded components 410 are scattered from component supply apparatus 88 onto stage 156 of component support member 150, camera 290 of imaging device 84, by operation of camera moving device 292, moves above component support member 150 and images leaded components 410. Then, leaded components 410 scattered on the upper surface of component support member 150, based on the imaging data, are divided into leaded components that can be picked up by suction nozzle 332 (also referred to as "pickup target components") and leaded components that cannot be picked up by suction nozzle 332 (also referred to as "non-pickup target components").

As it is not particularly relevant to the present disclosure, the method for dividing into pickup target components and non-pickup target components will be described only briefly: leaded components 410 with a surface, such as an uneven surface, that makes pickup difficult facing up, components with a lead 414 contacting the upper surface of component support member 150, tilted components, and the like are designated as non-pickup target components, and other leaded components 410 are designated as pickup target components. Based on the imaging data, information such as the position on component support member 150 and the orientation of leaded component 410 is obtained with regard to the leaded components 410 designated as pickup target components.

Then, based on the obtained position information of the pickup target components, component holding head 302 is moved above a pickup target component by operation of component holding head moving device 300 and the pickup target component is picked up using suction nozzle 332. Note that, when the pickup target component is picked up and held by suction nozzle 332, suction nozzle 332 is in the non-pivoted position.

Then, after holding leaded component 410 using suction nozzle 332, component holding head 302 is moved above component carrier 388. Then, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception recess 416 of component reception member 392. By this, as shown in FIG. 10, leaded component 410 is loaded in component receiving member 392 with leads 414 facing vertically downwards.

Also, when leaded component 410 is loaded on component receiving member 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the upper surface that is opposite to the bottom surface to which leads 414 are connected facing upwards. Therefore, suction nozzle 66 of work head 60 or 62 is able to appropriately hold leaded component 410.

(b) Collection and Replenishment of Leaded Components

With loose component supply device 32, when pickup target components are scattered on stage 156 of component support member 150, pickup of the scattered pickup target components is repeated and the picked up pickup target components are loaded on component receiving member 392. Then, by component carrier 388 mounted on component receiving member 392 being moved to the component supply position, supply of leaded components 410 is performed. However, if there are no pickup target components scattered on stage 156 of component support member 150, that is, all the leaded components 410 that can be picked up have been picked up and only non-pickup target components remain on stage 156, it is no longer possible to pick up a leaded component 410 from stage 156.

Thus, with loose component supply device 32, in such a case, leaded components 410 remaining on stage 156 are collected in component collection container 180. Then, leaded components 410 collected into component collection container 18 are scattered again onto stage 156, and by doing so the orientation of the leaded components 410 changes such that pickup of leaded components 410 from stage 156 can be restarted.

In detail, component support member 150 is moved below component supply apparatus 88 by operation of component support member moving device 152. That is, component support member 150 is moved from the exposed state (refer to FIG. 5) towards the stored state (refer to FIG. 6). Here, component collection container 180 provided at the front end of component support member 150 is oriented such that the opening is facing up, that is, component support member 150 is in the collection orientation. Therefore, leaded components 410 on stage 156 of component support member 150 are stopped by the front end of inclined plate 128 of component supply apparatus 88 in accordance with the movement of component support member 150. Further, as shown in FIG. 6, when component support member 150 reaches the stored state, leaded components 410 on stage 156 fall inside component collection container 180.

Continuing, component support member 150 is moved from the stored state towards the front by the operation of component support member moving device 152. Also, when component support member 150 has been moved forward from the stored state by a specified amount, container swinging device 181 of component returning device 92 is operated and component collection container 180 is swung. Accordingly, the orientation of component collection container 180 is changed suddenly from an orientation with the opening of facing up (collection orientation) to an orientation with the opening facing stage 156 (returning orientation). In this case, leaded components 410 collected in component collection container 180 are discharged with strong force towards stage 156. Thus, by scattering leaded components 410 on stage 156 from component collection container 180, the orientation of the leaded components 410 is changed, and leaded components 410 are picked up again from stage 156.

(D) Correction of Component Holding Position by Component Holding Head

With component supply device 32, as described above, a component scattered on stage 156 is imaged by camera 290 of imaging device 84, and the position of the component is calculated based on the imaging data. Then, by lowering suction nozzle 332 of component holding head 302 towards the calculated component position, the component is held by suction nozzle 332. Then, component holding head 302 is moved above component receiving member 392, and by lowering suction nozzle 332 towards component receiving member 392, the component held by suction nozzle 332 is loaded on component reception recess 416 of component receiving member 392. Thus, the component is supplied in a state loaded on component receiving member 392.

However, with loose component supply device 32, components are scattered on stage 156 in various states, and because the component holding height by suction nozzle 332 differs in accordance with the orientation of the component, due to various reasons, the holding position of the component is deviated, and it may not be possible to appropriately load the component on component reception recess 416 of component receiving member 392.

Figure 12:
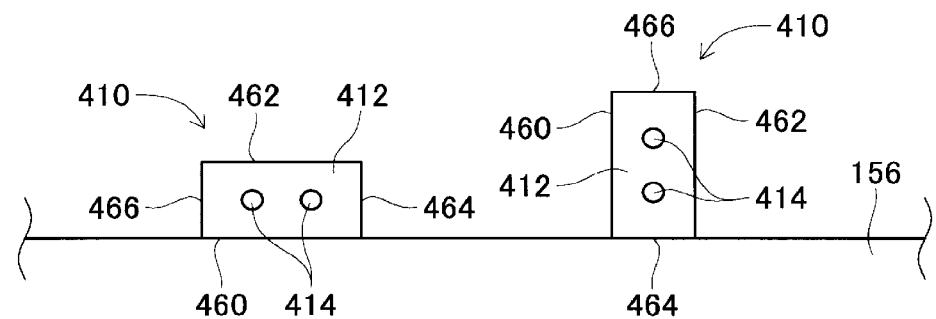
FIG. 12 is a schematic diagram showing a leaded component scattered on a stage.

In detail, for example, in a case of a leaded component 410 with a component main body that is cuboid, as shown in FIG. 12, if specified side surface 460 of component main body 412 is contacting the upper surface of stage 156, side surface 462 that is opposite side surface 460 is the side to be picked up by suction nozzle 332. Further, if side surface 464 that is next to side surface 460 of component main body 412 contacts the upper surface of stage 156, side surface 466 that is opposite side surface 464 is the side to be picked up by suction nozzle 332. In this manner, with loose component supply device 32, the component holding height by suction nozzle 332 differs in accordance with the orientation of the component scattered on stage 156.

Figure 13:
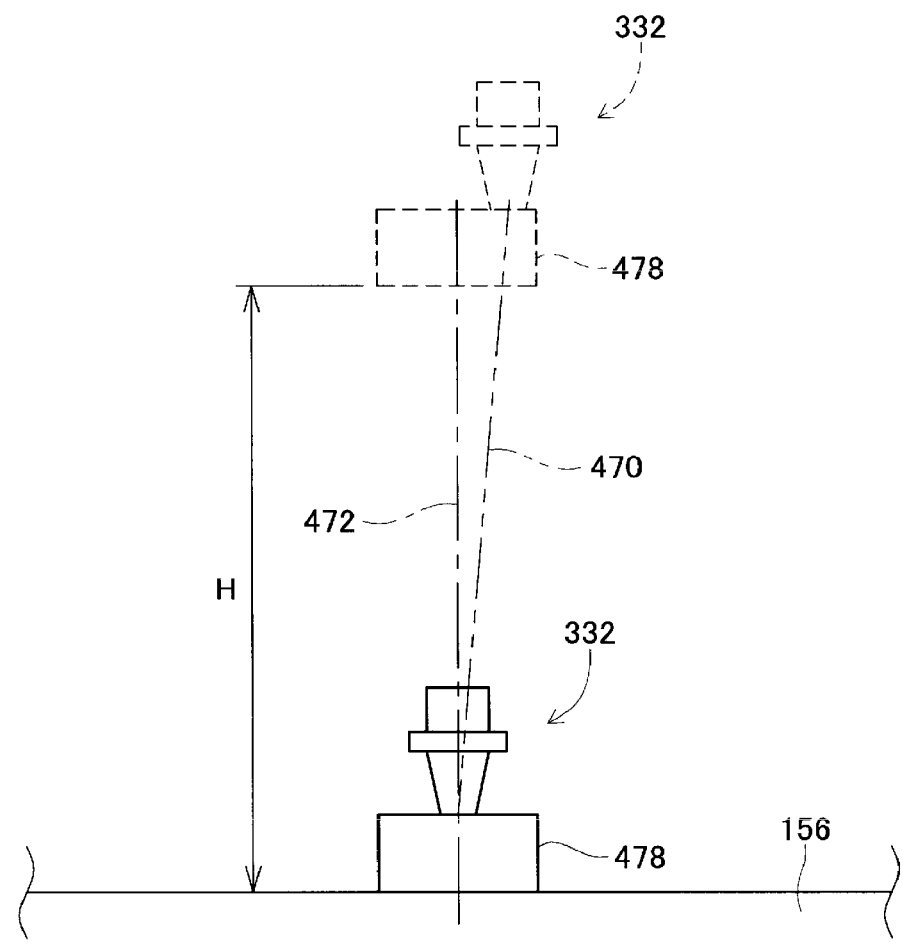
FIG. 13 is a schematic diagram showing a moving direction of a suction nozzle during raising and lowering.

Further, in cases in which the moving direction when suction nozzle 332 is being raised and lowered is deviated from the vertical direction, or the imaging direction of camera 290 that images the components scattered on stage 156 deviates from the vertical direction, or the like, the component holding position tends to deviate based on the change in the component holding height. Specifically, as shown in FIG. 13, descriptions are given for a case in which moving path 470 during raising and lowering of suction nozzle 332 is tilted with respect to vertical line 472 that extends vertically, that is, a case in which the direction when suction nozzle 332 is being raised and lowered is deviated from the vertical direction.

For example, when component 478 loaded directly on stage 156 is held by suction nozzle 332, suction nozzle 332 is assumed to hold the component 478 at a specified position (central position). With this assumption, for component 478, as shown by the broken line in the diagram, when loaded at a position higher than the upper surface of stage 156, suction nozzle 332 holds the component not at the specified position (central position), but at a position deviated from the specified position. That is, when the component holding height by suction nozzle 332 varies, the component holding position by suction nozzle 332 varies.

Figure 14:
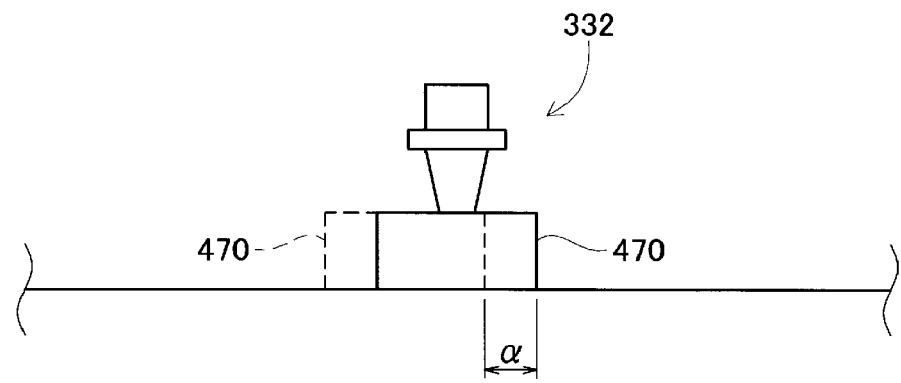
FIG. 14 is a schematic diagram showing a component mounted on a component receiving member.

Further, when suction nozzle 332 is holding component 478 at a position deviated from the specified position, when that component 478 is loaded on component receiving member 392, the loading position is different to the loading of the component held at the specified position by the suction nozzle 332. In other words, when suction nozzle 332 is holding component 478 at the specified position, and that component 478 is loaded, the component 478 will be loaded at the position shown by the solid line in FIG. 14. On the other hand, when suction nozzle 332 is holding component 478 at a position deviated from the specified position, and that component 478 is loaded, the component 478 will be loaded at the position shown by the broken line in FIG. 14. As can be understood from the diagram, the loading position of component 478 shown by the solid line and the loading position of component 478 shown by the broken line deviate greatly, and in such a case, the component 478 shown by the solid line is loaded appropriately on component reception recess 416 of component receiving member 392, but the component 478 shown by the broken line may not be loaded appropriately on component reception recess 416 of component receiving member 392.

Figure 15:
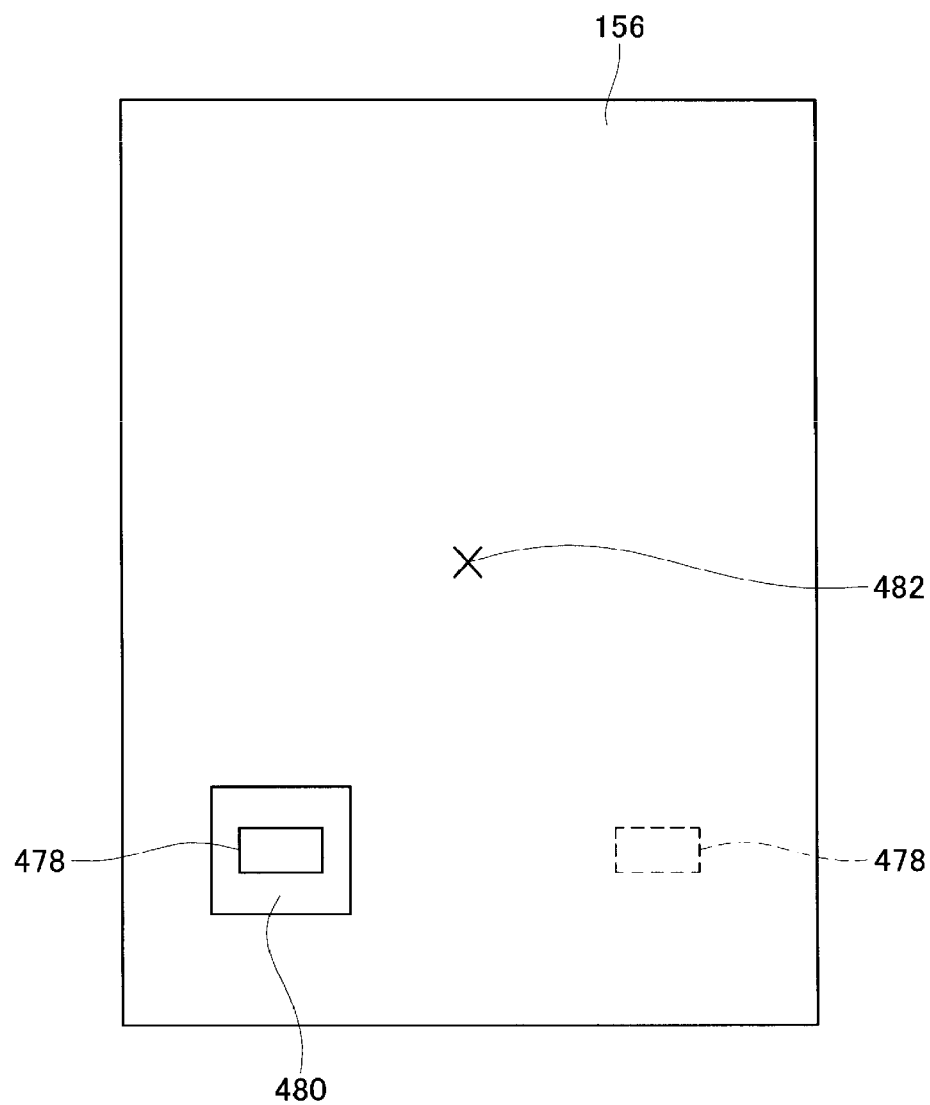
FIG. 15 is a plan view showing a stage on which a loading body is loaded.

Considering this, with loose component supply device 32, a component loaded at different heights is held by suction nozzle 332 and the held component is loaded at a specified position. Then, the deviation amount of the loading position from the specified position of the component loaded at a different height is calculated, and based on the calculated deviation, the holding position of the component by suction nozzle 332 is corrected. In detail, as shown in FIG. 15, cuboid loading body 480 is loaded at any given position of the upper surface of stage 156 by an operator. Here, the dimension in the height direction of loading body 480 when loading body 480 is loaded on the upper surface of stage 156 is H (refer to FIG. 13). Then, component 478 is loaded by the operator at any given position of the upper surface of loading body 480. Note that, the component 478 used here is a rectangular component used as a dedicated component for correcting the component holding position by suction nozzle 332.

Continuing, camera 290 of imaging device 84 is moved above loading body 480, and the component 478 loaded on loading body 480 is imaged by camera 290. Thus, the loading position of component 478 is calculated based the acquired imaging data. Then, based on the calculated loading position, operation of component holding head moving device 30 is controlled such that component 478 is held by suction nozzle 332. Next, the component 478 held by suction nozzle 332 is loaded temporarily at central position 482 of stage 156. Note that, central position 482 of stage 156 is the position shown by an "x" in the figure, and that position information is memorized in individual control device 452. In other words, operation of component holding head moving device 300 is controlled based on position information of central position 482 of stage 156 memorized in individual control device 452, such that component 478 held by suction nozzle 332 is loaded on the central position of stage 156. Note that, in the figure, central position 482 of stage 156 is shown by an "x", but there is no actual marking on the upper surface of stage 156.

Continuing, camera 290 is moved above central position 482 of stage 156, and component 478 loaded at central position 482 is imaged by camera 290. Thus, the loading position of component 478 is calculated based the acquired imaging data. Then, based on the calculated loading position, operation of component holding head moving device 30 is controlled such that component 478 is held by suction nozzle 332. Next, component 478 held by suction nozzle 332 is loaded at a specified position of component receiving member 392 of shuttle device 304. Note that, position information of the specified position of position receiving member 392 is memorized on individual control device 452, and by controlling operation of component holding head moving device 300 based on the position information, component 478 held by suction nozzle 332 is loaded at the specified position of component receiving member 392.

Note that, during component supply, component receiving member 392 with component reception recess 416 is used, but during imaging of component 478 using loading body 480, a component receiving member 392 without a component reception section 416 is used. That is, before performing imaging of component 478 using loading body 480, component receiving member 392 with component reception section 416 is removed from component carrier 388 and a component receiving member 392 without a component reception section 416 is attached to component carrier 388.

Then, when component 478 held by suction nozzle 332 is loaded at the specified position of component receiving member 392, camera 290 is moved above the specified position of component receiving member 392 and component 478 loaded at the specified position of component receiving member 392 is imaged by camera 290. Thus, the loading position of component 478 is calculated based on the acquired imaging data. That is, after the component 478 loaded on loading body 480 is held by suction nozzle 332, the loading position of the component 478 loaded on component receiving member 392 (hereinafter also referred to as "first height component loading position") is calculated based on the imaging data.

Next, when the first height component loading position has been calculated, component 478 loaded on component receiving member 392 is loaded at any given position on the upper surface of stage 156 by an operator. That is, component 478 is loaded on the upper surface of stage 156 at a height (second height) that is lower than the height (first height) of the upper surface of loading body 480 by H. Note that, component 478 loaded on the upper surface of stage 156 is shown by a broken line in FIG. 15. Next, upon component 478 being loaded on the upper surface of stage 156, camera 290 is moved above component 478 and component 478 loaded on the upper surface of stage 156 is imaged by camera 290. Thus, the loading position of component 478 is calculated based on the acquired imaging data. Then, based on the calculated loading position, operation of component holding head moving device 30 is controlled such that component 478 is held by suction nozzle 332. Next, the component 478 held by suction nozzle 332 is loaded temporarily at central position 482 of stage 156.

Continuing, camera 290 is moved above central position 482 of stage 156, and component 478 loaded at central position 482 is imaged by camera 290. Thus, the loading position of component 478 is calculated based on the acquired imaging data. Then, based on the calculated loading position, operation of component holding head moving device 30 is controlled such that component 478 is held by suction nozzle 332. Next, component 478 held by suction nozzle 332 is loaded at a specified position of component receiving member 392. Note that, the specified position of component receiving member 392 on which component 478 held from loading body 480 is loaded and the specified position of component receiving member 392 on which component 478 held from stage 156 is loaded are, of course, the same.

Then, when component 478 held by suction nozzle 332 is loaded at the specified position of component receiving member 392, camera 290 is moved above the specified position of component receiving member 392 and component 478 loaded at the specified position of component receiving member 392 is imaged by camera 290. Thus, the loading position of component 478 is calculated based on the acquired imaging data. That is, after the component 478 loaded on stage 156 is held by suction nozzle 332, the loading position of the component 478 loaded on component receiving member 392 (hereinafter also referred to as "second height component loading position") is calculated based on the imaging data.

Next, upon calculating first height component loading position and second height component loading position, deviation amount α (refer to FIG. 14) of the loading position of component 478 is calculated based on the first height component loading position and the second height component loading position. By this, deviation amount α of the loading position of component 478 with respect to height dimension H of loading body 480, that is, deviation amount α of the loading position of component 478 with respect to the difference (H) in the heights of the holding positions of component 478 is estimated. In other words, the tilt angle of movement path 470 during raising and lowering of suction nozzle 332 with respect to vertical line 472 is estimated.

Further, the holding height by suction nozzle 332 of leaded component 410 scattered on stage 156 is identified for each orientation of the scattered component. Thus, based on deviation amount α of the loading position of component 478 with respect to height dimension H of loading body 480, the holding position of leaded component 410 by suction nozzle 332 is corrected for each holding height by suction nozzle 332 of different leaded components 410 in accordance with the scattering orientation of the component. Therefore, even in a case in which the holding height of leaded component 410 by suction nozzle 332 differs in accordance with a scattering orientation, the deviation amount of the loading position on component receiving member 392 is reduced, and leaded component 410 can be appropriately loaded on component reception section 416 of component receiving member 392.

In particular, with loose component supply device 32, because there is no imaging device capable of imaging suction nozzle 332 holding a component, it is particularly advantageous to perform the above correction of the holding position using loading body 480. In detail, for example, imaging device 28 is provided on component mounter 10 and imaging device 28 is able to image suction nozzle 66 holding a component. Thus, suction nozzle 66 positioned at a specified height and suction nozzle 66 positioned at a height different to that specified height is imaged, and based on the imaging data, it is possible to estimate a tilt angle of the movement path during raising and lowering of suction nozzle 66 with respect to a vertical line. Further, using that tilt angle, it is possible to correct the holding position by suction nozzle 66. On the other hand, with loose component supply device 32, because there is no imaging device capable of imaging suction nozzle 332, it is not possible to correct the holding position of suction nozzle 332 using imaging data of suction nozzle 332. Therefore, with loose component supply device 32, it is particularly advantageous to perform the above correction of the holding position using loading body 480.

Also, after both component 478 loaded on loading body 480 and component 478 loaded on stage 156 have been held by suction nozzle 332, they are temporarily loaded on central position 482 of stage 156 and then held again by suction nozzle 332 and loaded again on component receiving member 392. This is to reduce the effect of the difference in the tilt angle during raising and lowering of the nozzle in accordance with the holding position of component 478 due to the fact that there is a tendency, although slight, for the tilt angle of movement path 470 during raising and lowering of suction nozzle 332 with respect to vertical line 472 (hereinafter also referred to as "tilt angle during nozzle raising and lowering") to vary in accordance with the holding position of component 478.

In detail, as shown in FIG. 15, the holding position of component 478 loaded on loading body 480 (position shown by solid lines) and the holding position of component 478 loaded on stage 156 (position shown by broken lines) are different. Therefore, the tilt angle during nozzle raising and lowering for the loading position of component 478 loaded on loading body 480 may be different to the tilt angle during nozzle raising and lowering for the holding position of component 478 loaded on stage 156. In such a case, the difference in the tilt angle during nozzle raising and lowering in accordance with the holding position affects deviation amount α (refer to FIG. 14) of the loading position of component 478 on component receiving member 392, meaning that it may not be possible to appropriately correct the holding position by suction nozzle 332. Thus, component 478 loaded on loading body 480 and component 478 loaded on stage 156 are temporarily loaded on central position 482 of stage 156 and each component 478 is held again by suction nozzle 332 at central position 482. Therefore, there is no difference in the tilt angle during nozzle raising and lowering in accordance with the holding position, making it possible to appropriately measure deviation amount α of the loading position of component 478 on component receiving member 392, thereby guaranteeing appropriate correction of the holding position by suction nozzle 332.

Further, the correction of the holding position using loading body 480 is performed before loose component supply device 32 is shipped, but with a conventional device, correction of deviation in the holding position of a component by a suction nozzle 332 arising, for example, in a case in which the mounting direction during raising and lowering of suction nozzle 332 is deviated from the vertical direction, in a case in which the imaging direction of camera 290 that images components scattered on stage 156 is deviated from a vertical direction, or the like, is not performed before the device is shipped. Thus, the moving direction during raising and lowering of suction nozzle 332 needs to be made a vertical direction, which requires extremely high assembly accuracy when assembling the mechanism that moves suction nozzle 332 up and down. Also, the imaging direction of camera 290 needs to be a vertical direction, which requires extremely high assembly accuracy when assembling camera 290. In contrast, by performing correction of the loading position using loading body 480, even if the moving direction during raising and lowering of suction nozzle 332 is slightly deviated from a vertical direction, it is possible to load leaded component 410 appropriately on component reception section 416 of component receiving member 392. By this, the assembly accuracy requirements for loose component supply device 32 can be relaxed to a certain extent, which allows assembly time for the device to be reduced.

Note that, as shown in FIG. 11, individual control device 452 includes: first operation control section 500; first imaging section 502; second operation control section 504; second imaging section 506; and calculating section 508. First operation control section 500 is a functional section for temporarily moving component 478 loaded on loading body 480 to a central position on stage 156, then loading the component 478 to a specified position on component receiving member 392. First imaging section 502 is a functional section for using camera 290 to image component 478 loaded from loading body 480 to the specified position on component receiving member 392. Second operation control section 504 is a functional section for temporarily moving component 478 loaded on stage 156 to a central position on stage 156, then loading the component 478 to a specified position on component receiving member 392. Second imaging section 506 is a functional section for using camera 290 to image component 478 loaded from stage 156 to the specified position on component receiving member 392. Calculating section 508 is a functional section for calculating deviation amount α of the loading position of component 478 on component receiving member 392.

Note that, loose component supply device 32 is an example of an operation machine. Imaging device 84 is an example of an imaging device. Stage 156 is an example of a stage. Component holding head moving device 300 is an example of a moving device. Component holding head 302 is an example of a holding head. Suction nozzle 332 is an example of a holding tool. Component receiving member 392 is an example of a loading section. Individual control device 452 is an example of a control device. First operation control section 500 is an example of a first operation control section. First imaging section 502 is an example of a first imaging section. Second operation control section 504 is an example of a second operation control section. Second imaging section 506 is an example of a second imaging section. Calculating section 508 is an example of a calculating section.

Further, the present disclosure is not limited to the above example embodiments, and various changed or improved methods of embodiment are possible based on the knowledge of someone skilled in the art. Specifically, for example, in an embodiment above, deviation amount α of component 478 moved to component receiving member 392 from two locations, loading body 480 and stage 156, is calculated, but component 478 may be loaded on loading body 478 and stage 156 each with different heights and the deviation amount α of component 478 when that component 478 is loaded on component receiving member 392 may be calculated. That is, component 478 may be moved to component receiving member 392 from three or more locations, that is, loading body 480, stage 156, and a separate member, and the deviation amount α of component 478 may be calculated for this case.

Further, in an embodiment above, descriptions are given for a case of a tilt of the moving direction during raising and lowering of suction nozzle 332 using a vertical direction as a reference, but a moving direction to the left and right of component holding head 302, that is, a direction perpendicular with respect to a plane surface that includes the XY may be used as reference, or a direction perpendicular to the upper surface of stage 156 may be used as a reference.

Also, in an embodiment above, the holding position of the component by suction nozzle 332 is corrected based on deviation amount α of the loading position of component 478 on component receiving member 392, but the loading position of the component held by suction nozzle 332 may be corrected. That is, in a case in which the holding height of the component by suction nozzle 332 differs, the holding position of the component may be corrected such that the component held by suction nozzle 332 is loaded at a position deviated from the specified position in consideration of the deviation of the loading position of component 478 on component receiving member 392.

In an embodiment above, when holding a component from stage 156 of loose component supply device 32, correction of the holding position of the component by suction nozzle 332 is performed according to the above method, but when holding a component from a different position, correction of the holding position of the component by suction nozzle 332 may also be performed according to the above method. Specifically, for example, when holding a component from a component tray of a tray-type supply device, the holding position of the component by suction nozzle 332 may be corrected according to the above method.

Also, in embodiments above, the present disclosure is applied to leaded components, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (operation machine);
84: imaging device;
156: stage;
300: component holding head moving device (moving device);
302: component holding head (holding head);
332: suction nozzle (holding tool);
392: component received member (loading section);
452: individual control device (control device);
500: first operation control section;
502: first imaging section;
504: second operation control section;
506: second imaging section;
508: calculating section

The invention claimed is:

1. An operation machine comprising:
 a holding head including a holding tool configured to hold a component loaded at a given position;
 an imaging device configured to image the component loaded at the given position;
 a moving device configured to move the holding head; and
 a control device, the control device being provided with
  a first operation control section configured to control operation of the holding head and the moving device such that a face of the component is held by the holding tool, the component loaded at a first height with reference to a surface of the operation machine, and the component held by the holding tool is loaded at a first set position,
  a first imaging section configured to image the component loaded at the first set position by the first operation control section,
  a second operation control section configured to control operation of the holding head and the moving device such that the holding tool holds the face of the component, the component loaded at a second height that is different to the first height with reference to the surface, and loads the component held by the holding tool at a second set position,
  a second imaging section configured to image the component loaded at the second set position by the second operation control section, and
  a calculating section configured to calculate a position deviation amount of the loaded component based on imaging data acquired by the first imaging section and imaging data acquired by the second imaging section.

2. The operation machine according to claim 1, wherein the operation machine further comprises:
 a stage on which the components are scattered;
 the holding head including the holding tool configured to pick up the component scattered on the stage; and
 a loading section on which the component held by the holding tool is to be loaded, wherein
 the component is supplied in a state loaded on the loading section.

3. The operation machine according to claim 2, wherein the first operation control section is configured to control operation of the holding head and the moving device such that the component loaded at the first height is held by the holding tool, and the component held by the holding tool is loaded at a specified position on the stage, then, the component is held by the holding tool again, and loaded at the set position set on the loading section again, and
 the second operation control section is configured to control operation of the holding head and the moving device such that the component loaded at the second height is held by the holding tool, and the component held by the holding tool is loaded at the specified position on the stage, then, the component is held by the holding tool again, and loaded at the set position set on the loading section again.

* * * * *